United States Patent
Stender et al.

(10) Patent No.: US 10,144,850 B2
(45) Date of Patent: Dec. 4, 2018

(54) STOP-ON SILICON CONTAINING LAYER ADDITIVE

(71) Applicant: Air Products and Chemicals, Inc., Allentown, PA (US)

(72) Inventors: Matthias Stender, Phoenix, AZ (US); Maitland Gary Graham, Tempe, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/268,956

(22) Filed: Sep. 19, 2016

(65) Prior Publication Data

US 2017/0088748 A1  Mar. 30, 2017

Related U.S. Application Data (60) Provisional application No. 62/233,251, filed on Sep. 25, 2015.

(51) Int. Cl.
*C09G 1/04* (2006.01)
*C09K 3/14* (2006.01)
(Continued)

(52) U.S. Cl.
CPC .................. *C09G 1/04* (2013.01); *C09G 1/02* (2013.01); *C09K 3/1463* (2013.01); *H01L 21/31053* (2013.01); *H01L 21/3212* (2013.01); *H01L 21/7684* (2013.01); *H01L 21/76819* (2013.01); *C08K 3/22* (2013.01); *C08K 3/36* (2013.01); *C08K 2003/2237* (2013.01); *C08K 2003/2241* (2013.01); *C08K 2003/2244* (2013.01)

(58) Field of Classification Search
None
See application file for complete search history.

(56) References Cited

U.S. PATENT DOCUMENTS

| 3,922,393 A | 11/1975 | Sears, Jr. |
| 4,654,315 A | 3/1987 | Hsieh |

(Continued)

FOREIGN PATENT DOCUMENTS

| EP | 1813656 A2 | 8/2007 |
| JP | 60086187 | 5/1985 |

(Continued)

OTHER PUBLICATIONS

Herrmann, M., "Corrosion of Silicon Nitride Materials in Aqueous Solutions", J. Am. Ceram. Soc., 96 [10]. (2013), pp. 3009-3022.

(Continued)

*Primary Examiner* — Allan Olsen
(74) *Attorney, Agent, or Firm* — Lina Yang (57) ABSTRACT

Chemical mechanical polishing (CMP) compositions, methods and systems are for polishing patterned semiconductor wafers. The CMP compositions comprising an abrasive and a water soluble aluminum compound additive with a pH>7 suppress CMP stop layer (a silicon containing layer, such as silicon nitride, silicon oxide, or silicon carbide) removal rate. CMP compositions optionally contain surfactant to help wet surface; a corrosion inhibitor to provide corrosion inhibition on metal lines, vias, or trenches; and a pH adjusting agent that is used to adjust pH of the CMP polishing composition.

2 Claims, 7 Drawing Sheets

CMP Composition (51) Int. Cl.
*H01L 21/768* (2006.01)
*C09G 1/02* (2006.01)
*H01L 21/321* (2006.01)
*H01L 21/3105* (2006.01)
*C08K 3/22* (2006.01)
*C08K 3/36* (2006.01)

(56) References Cited

U.S. PATENT DOCUMENTS

| | | | | |
|---|---|---|---|---|
| 5,104,421 | A * | 4/1992 | Takizawa | B24B 13/01 106/3 |
| 5,230,833 | A | 7/1993 | Romberger et al. | |
| 5,935,278 | A * | 8/1999 | Ishitobi | C09G 1/02 106/11 |
| 6,454,821 | B1 * | 9/2002 | Abbasi | C03C 19/00 106/3 |
| 6,969,555 | B2 | 11/2005 | Meschter et al. | |
| 7,071,105 | B2 | 7/2006 | Carter et al. | |
| 7,291,188 | B2 * | 11/2007 | Hirabayashi | B24B 37/24 451/526 |
| 8,038,752 | B2 * | 10/2011 | Carter | C09G 1/02 51/307 |
| 9,607,647 | B2 * | 3/2017 | Itaya | G11B 5/7315 |
| 2002/0025762 | A1 | 2/2002 | Luo et al. | |
| 2003/0041526 | A1 * | 3/2003 | Fujii | C09G 1/02 51/307 |
| 2003/0110711 | A1 * | 6/2003 | Ota | B24B 37/044 51/308 |
| 2003/0121214 | A1 * | 7/2003 | Ishibashi | C09G 1/02 51/309 |
| 2004/0123527 | A1 * | 7/2004 | Kitayama | C09G 1/02 51/307 |
| 2004/0152325 | A1 * | 8/2004 | Ejiri | C09G 1/02 438/691 |
| 2005/0032463 | A1 * | 2/2005 | Kitayama | C09G 1/02 451/41 |
| 2005/0148185 | A1 * | 7/2005 | Hirabayashi | B24B 37/24 438/692 |
| 2005/0230355 | A1 * | 10/2005 | Salzle | C03C 15/02 216/97 |
| 2006/0046490 | A1 * | 3/2006 | Banerjee | C09G 1/02 438/692 |
| 2006/0063326 | A1 * | 3/2006 | Brooks | H01L 21/3212 438/243 |
| 2007/0037892 | A1 | 2/2007 | Belov | |
| 2007/0049025 | A1 | 3/2007 | Siddiqui et al. | |
| 2007/0054495 | A1 * | 3/2007 | Compton | C09G 1/02 438/693 |
| 2007/0176142 | A1 | 8/2007 | Kikuchi | |
| 2007/0251156 | A1 * | 11/2007 | Siddiqui | C09G 1/02 51/307 |
| 2008/0087644 | A1 * | 4/2008 | Nishioka | C09G 1/02 216/89 |
| 2008/0096390 | A1 * | 4/2008 | Li | C09G 1/02 438/693 |
| 2008/0149884 | A1 * | 6/2008 | Siddiqui | C09G 1/02 252/79.2 |
| 2012/0142183 | A1 * | 6/2012 | Eissa | C09G 1/02 438/612 |
| 2012/0238094 | A1 | 9/2012 | Minami et al. | |
| 2015/0248910 | A1 * | 9/2015 | Itaya | G11B 5/73 428/836 |
| 2017/0186459 | A1 * | 6/2017 | Itaya | G11B 5/7315 |
| 2017/0194025 | A1 * | 7/2017 | Itaya | G11B 5/7315 |

FOREIGN PATENT DOCUMENTS

| | | |
|---|---|---|
| JP | 11186202 | 7/1999 |
| JP | 2000256655 | 9/2000 |
| JP | 2002028850 A | 1/2002 |
| JP | 2002338232 | 11/2002 |
| JP | 2004204117 A | 7/2004 |
| JP | 2006520530 A | 9/2006 |
| JP | 2007153692 | 6/2007 |
| JP | 2008182213 A | 8/2008 |
| JP | 2008280229 A2 | 11/2008 |
| WO | 2016043089 A1 | 3/2016 |

OTHER PUBLICATIONS

Kohei Oda, "Hydrothermal Corrosion of Pure, Hot Isostatically Pressed Silicon Nitride", J. Am. Ceram. Soc., 76 [5], (1993), pp. 1365-1368.

Klemm, Hagen, "Silicon Nitride for High-Temperature Applications", J. Am. Ceram. Soc., 93 [6], (2010) pp. 1501-1522.

* cited by examiner

STOP-ON SILICON CONTAINING LAYER ADDITIVE

CROSS REFERENCE TO RELATED PATENT APPLICATIONS

The application claims the benefit of U.S. Application No. 62/233,251 filed on Sep. 25, 2015. The disclosure of Application No. 62/233,251 is hereby incorporated by reference

BACKGROUND

The present invention relates to chemical mechanical planarization/planarization ("CMP") polishing formulations (CMP composition or CMP formulations, CMP slurry or slurries are used interchangeably) for the CMP of patterned substrate surfaces, such as, for example, patterned semiconductor wafers.

More particularly, also described herein is a CMP polishing composition for polishing patterned wafers having multi-type films, such as barrier, Low k or ultra Low k, dielectric, and metal lines or vias or trenches.

There are several CMP steps in integrated circuit (IC) manufacturing process. When a CMP processing is applied, a multi-step CMP process may be employed involving the initial removal and planarization of the copper overburden, referred to as a step 1 copper CMP process, followed by a barrier layer CMP process. The barrier layer CMP process is frequently referred to as a barrier or step 2 CMP process.

CMP processing employed a barrier CMP composition at stage 2 is often used to remove and planarize excess metal layers and other films on the surface of the patterned wafers to achieve global planarization.

To address the issue of significant dielectric and metal, such as copper loss of the patterned wafer structure, a CMP stop layer can be used. The CMP stop layer can stop the metal CMP, especially barrier layer CMP, from removing dielectric layer underneath the barrier layer. The CMP stop layer is effective in protecting the structure against overpolishing. The CMP stop layer may be made of silicon containing materials, such as silicon nitride (abbreviated SiN), silicon oxide ($SiO_2$), or silicon carbide (SiC). Thus, some CMP applications require very low removal rates for SiN and/or SiC, since they might be used a stop layer in a certain film stack.

There are works been done in the art to achieve very low SiN rates for shallow trench isolation (STI) applications. Babu et al. (Journal of The Electrochemical Society, 156, 12, H936-H943, 2009) or Carter et al. (U.S. Pat. No. 7,071,105; Electrochemical and Solid-State Letters, 8, 8, G218-G221, 2005) reported on additives to increase the selectivity of silicon oxide to silicon nitride.

Mainly, the addition of certain organic acids was used in the CMP slurries, as for example picolinic acid. However, all these prior art examples use ceria particles as abrasive which features a completely different removal mechanism than silica particles as abrasive so that additives which work with ceria like picolinic acid do not work at all with silica particles.

Furthermore, STI slurries are usually used at a pH range of 4-7 which is not suitable for advanced barrier applications due to potential corrosion issues on metal films.

Additionally, ceria slurries cannot be used in combination with hydrogen peroxide or other suitable oxidizer which are generally required to achieve sufficient metal or barrier film removal rates.

Therefore, there are significant needs for CMP slurries, methods, and systems that can perform CMP for very low removal rate on the stop layer (such as silicon containing layers) while providing other meeting other requirements such as removal rates for other layers, low dishing and low defects.

SUMMARY

Described herein are CMP polishing compositions, methods and systems that satisfy the need. Present invention discloses the use of an additive in CMP slurries, for suppressing removal rates of a silicon containing films during CMP process; wherein the additive is a water soluble aluminum compound.

In one embodiment, described herein is a CMP polishing composition comprising:
  0.01 wt % to 20 wt % of an abrasive selected from the group consisting of high purity colloidal silica particles, alumina, ceria, germania, silica, titania, zirconia, alumina dopes colloidal silica in lattices, and mixtures thereof;
  0.01% to about 10 wt % of a water soluble aluminum compound;
  optionally,
    0.0001 wt % to about 5 wt % of a pH adjusting agent;
    0.0001 wt % to 10 wt % of a surfactant selected from the group consisting of a). non-ionic surface wetting agents; b). anionic surface wetting agents; c). cationic surface wetting agents; d). ampholytic surface wetting agents; and mixtures thereof;
    0.0005 wt % to about 0.5 wt % of a corrosion inhibitor;
    0.01 wt % to 10 wt % of an oxidizing agent selected from the group consisting of peroxy-compound comprising at least one peroxy group (O—O), oxidized halide, perboric acid, perborate, percarbonate, peroxyacid, permanganate, chromate, cerium compound, ferricyanide, and mixtures thereof; and
    0.1 wt % to 5 wt % of an organic acid;
  and
  water;
  wherein the polishing composition has a pH above 7; preferably from about 8 to 12;
  more preferably from about 10 to 12.

In a further embodiment, described herein is a polishing method for chemical mechanical planarization of a semiconductor device comprising at least one surface having a first material and a second material comprising at least one silicon containing material; comprising the steps of:
  a) contacting the at least one surface with a polishing pad;
  b) delivering a polishing composition to the at least one surface, the polishing composition comprising:
    0.01 wt % to 20 wt % of an abrasive selected from the group consisting of high purity colloidal silica particles, alumina, ceria, germania, silica, titania, zirconia, alumina dopes colloidal silica in lattices, and mixtures thereof;
    0.01% to about 10 wt % of a water soluble aluminum compound;
    optionally,
      0.0001 wt % to about 5 wt % of a pH adjusting agent;
      0.0001 wt % to 10 wt % of a surfactant selected from the group consisting of a). non-ionic surface wetting agents; b). anionic surface wetting agents; c). cationic surface wetting agents; d). ampholytic surface wetting agents; and mixtures thereof;

0.0005 wt % to about 0.5 wt % of a corrosion inhibitor;

0.01 wt % to 10 wt % of an oxidizing agent selected from the group consisting of peroxy-compound comprising at least one peroxy group (O—O), oxidized halide, perboric acid, perborate, percarbonate, peroxyacid, permanganate, chromate, cerium compound, ferricyanide, and mixtures thereof; and 0.1 wt % to 5 wt % of an organic acid;

and water;

wherein the polishing composition has a pH above 7; preferably from about 8 to 12;

more preferably from about 10 to 12;

c) polishing the at least one surface with the polishing composition to remove the first material and to stop-on the second material.

In yet another embodiment, described herein is a system for chemical mechanical planarization, comprising:

a patterned substrate comprising at least one surface having a first material and a second material comprising at least one silicon containing material;

a polishing pad; and a polishing composition to the at least one surface, the polishing composition comprising:

0.01 wt % to 20 wt % of an abrasive selected from the group consisting of high purity colloidal silica particles, alumina, ceria, germania, silica, titania, zirconia, alumina dopes colloidal silica in lattices, and mixtures thereof;

0.01% to about 10 wt % of a water soluble aluminum compound;

optionally, 0.0001 wt % to about 5 wt % of a pH adjusting agent;

0.0001 wt % to 10 wt % of a surfactant selected from the group consisting of a). non-ionic surface wetting agents; b). anionic surface wetting agents; c). cationic surface wetting agents; d). ampholytic surface wetting agents; and mixtures thereof;

0.0005 wt % to about 0.5 wt % of a corrosion inhibitor;

0.01 wt % to 10 wt % of an oxidizing agent selected from the group consisting of peroxy-compound comprising at least one peroxy group (O—O), oxidized halide, perboric acid, perborate, percarbonate, peroxyacid, permanganate, chromate, cerium compound, ferricyanide, and mixtures thereof; and 0.1 wt % to 5 wt % of an organic acid;

and water;

wherein the polishing composition has a pH above 7; preferably from about 8 to 12;

more preferably from about 10 to 12; and the at least one surface is in contact with the polishing pad and the polishing composition.

The water soluble aluminum compound additive includes, but is not limited to, sodium aluminate, potassium aluminate, aluminum acetate, aluminum chloride, aluminum sulfate, aluminum hydroxide, and combinations thereof. It is desired that the aluminum compound should be soluble in slurry formulation at the concentrations added. Aluminate salts are preferable forms of aluminum compounds. Aluminate salt can be generated in situ in the CMP slurry formulation by using compounds of aluminum such as aluminum hydroxide, $Al(OH)_3$ or aluminum salts such as aluminum acetate, aluminum chloride, aluminum sulfate, etc. with a suitable hydroxide base such as potassium hydroxide, KOH, or sodium hydroxide, NaOH.

The water soluble aluminum compound may be present in the concentration ranging from 0.01% to about 10 wt %, or more preferably between 0.05% to about 5 wt % or more preferably between 0.1 wt % and 1 wt %.

The pH-adjusting agent in the polishing composition is selected from the group consisting of hydrochloric acid, nitric acid, sulfuric acid, chloroacetic acid, tartaric acid, succinic acid, citric acid, malic acid, malonic acid, sulfonic acid, phosphoric acid, fatty acid, polycarboxylic acid, hydrogen chloride, and mixtures thereof; or is selected from the group consisting of potassium hydroxide, sodium hydroxide, ammonia, quaternary organic ammonium hydroxide (e.g. tetramethylammonium hydroxide), ethylenediamine, piperazine, polyethyleneimine, modified polyethyleneimine, and mixtures thereof.

The corrosion inhibitor in the polishing composition is a chemical additive containing nitrogen atoms in the molecules, preferably selected from the group consisting of benzotriazole (BTA) and its derivatives, triazole and its derivatives (e.g. 3-amino-1,2,4-triazole and 3,5-diamino-1, 2,4-triazole); imidizole and its derivatives, pyrazole and its derivatives, benzoimidazole and its derivatives, and combinations thereof. The organic acid can be any suitable organic acid includes but is not limited to an aromatic organic acid (e.g. benzenesulfonic acid, toluenesulfonic acid), and amino acid or salt thereof.

Non-ionic surfactants may be chosen from a range of chemical types including but not limited to long chain alcohols, ethoxylated alcohols, ethoxylated acetylenic diol surfactants, polyethylene glycol alkyl ethers, proplylene glycol alkyl ethers, glucoside alkyl ethers, polyethylene glycol octylphenyl ethers, polyethylene glycol alkylphenyl ethers, glycerol alkyl esters, polyoxyethylene glycol sorbiton alkyl esters, sorbiton alkyl esters, cocamide monoethanol amine, cocamide diethanol amine dodecyl dimethylamine oxide, block copolymers of polyethylene glycol and polypropylene glycol, polyethoxylated tallow amines, fluorosurfactants. The molecular weight of surfactants may range from several hundreds to over 1 million. The viscosities of these materials also possess a very broad distribution.

Anionic surfactants include, but are not limited to salts with suitable hydrophobic tails, such as alkyl carboxylate, alkyl polyacrylic salt, alkyl sulfate, alkyl phosphate, alkyl bicarboxylate, alkyl bisulfate, alkyl biphosphate, such as alkoxy carboxylate, alkoxy sulfate, alkoxy phosphate, alkoxy bicarboxylate, alkoxy bisulfate, alkoxy biphosphate, such as substituted aryl carboxylate, substituted aryl sulfate, substituted aryl phosphate, substituted aryl bicarboxylate, substituted aryl bisulfate, substituted aryl biphosphate etc. The counter ions for this type of surface wetting agents include, but are not limited to potassium, ammonium and other positive ions. The molecular weights of these anionic surface wetting agents range from several hundred to several hundred-thousands.

Cationic surface wetting agents possess the positive net charge on major part of molecular frame. Cationic surfactants are typically halides of molecules comprising hydrophobic chain and cationic charge centers such as amines, quaternary ammonium, benzyalkonium and alkylpyridinium ions.

Yet, in another aspect, the surfactant can be an ampholytic surface wetting agents possess both positive (cationic) and negative (anionic) charges on the main molecular chains and with their relative counter ions. The cationic part is based on primary, secondary, or tertiary amines or quaternary ammonium cations. The anionic part can be more variable and include sulfonates, as in the sultaines CHAPS (3-[(3-Cholamidopropyl)dimethylammonio]-1-propanesulfonate) and cocamidopropyl hydroxysultaine. Betaines such as cocamidopropyl betaine have a carboxylate with the ammonium. Some of the ampholytic surfactants may have a phosphate anion with an amine or ammonium, such as the phospholipids phosphatidylserine, phosphatidylethanolamine, phosphatidylcholine, and sphingomyelins.

The first material includes but is not limited to metal films selected from the group consisting of Cu, W, Co, Al and combinations thereof; barrier or liner films selected from the group consisting of Ta, TaN, Ti, TiN, Ru and combinations thereof; dielectric films including low-k material; and combinations thereof; and the at least one silicon containing material includes but is not limited to silicon nitride, silicon oxide, silicon carbide, and combinations thereof.

BRIEF DESCRIPTION OF THE DRAWINGS

The present invention will hereinafter be described in conjunction with the appended figures wherein like numerals denote like elements.

DETAILED DESCRIPTION

Many CMP applications involve simultaneous polishing of two or more layers, wherein the one or more layers is polished at high rates relative to another layer (stopping layer) which needs to be polished at a much lower rate. Many applications use a stopping layer comprising silicon or a compound of silicon including but not limited to silicon oxide, silicon nitride, silicon oxy-nitride, silicon carbide or silicon oxy-carbide, poly-silicon, amorphous silicon or any other combination comprising silicon, oxygen, oxygen, carbon, nitrogen, hydrogen. This can be very difficult to achieve since high removal rates for other films in the stack may be only achievable with a high abrasive loading inevitably leading to a higher removal rate for the stopping film. This is particularly problematic if silica particles are used as abrasives and a higher pH (>7) is necessary for performance reasons. Silicon containing films such as SiN or $SiO_2$ undergo hydrolysis in alkaline pH range resulting in higher removal rates of the films. Therefore, there is a need for additives that allow stopping on SiN and/or SiC without sacrificing any other removal rates or selectivities.

The first material includes but is not limited to metal films selected from the group consisting of Cu, W, Co, Al and combinations thereof; barrier or liner films selected from the group consisting of Ta, TaN, Ti, TiN, Ru and combinations thereof; dielectric films including low-k material; and combinations thereof; and the at least one silicon containing material includes but is not limited to silicon nitride, silicon oxide, silicon carbide, and combinations thereof.

Formulations of this invention are especially useful for polishing semiconductor wafers containing different levels of materials. The wafer contains at least a surface comprising a first material and at least one silicon containing material.

Formulations of this invention are especially useful for reducing the removal rates of silicon containing films such as silicon oxide ($SiO_2$), silicon nitride (SiN), silicon carbide (SiC), silicon oxy-carbide (SiOC)

Compositions of this invention provides at least one of the following: (1) low removal rates of a stop layer; (2) maintaining a high removal rates of various types of other film/layer; (3) desirable selectivity among various films; (4) a desirable low level of within a wafer non-uniformity ("WIW NU %"); and (5) low residue level(s) being present on the polished wafer(s) subsequent to CMP processing.

Present invention discloses the use of an additive in CMP slurries, for suppressing removal rates of a silicon containing films during CMP process; wherein the additive is a water soluble aluminum compound.

CMP compositions of present invention comprise abrasive particles, water soluble aluminum compound, and water. Optionally compositions may also comprise other functional additives including but not limited to complexing or chelating agents, pH modifiers, removal rate selectivity modifiers, corrosion inhibitors, oxidizers, surfactants, dispersants, catalysts, and biocides or preservatives.

The water soluble aluminum compound additive includes, but is not limited to, sodium aluminate, potassium aluminate, aluminum acetate, aluminum chloride, aluminum sulfate, aluminum hydroxide, and combinations thereof. Preferable for of aluminum containing compound is aluminates. Alternatively, the aluminate salt can be generated in situ in the CMP slurry formulation by using a compounds of aluminum such as aluminum hydroxide, $Al(OH)_3$ or aluminum salts such as aluminum acetate, aluminum chloride, aluminum sulfate, etc. with a suitable hydroxide base such as potassium hydroxide, KOH, or sodium hydroxide, NaOH. In alkaline pH, the salts may undergo hydrolysis and form aluminate anions ($[Al(OH)_4]^-$). Aluminate anions may undergo polymerization to form dimeric or polymeric aluminum complexes.

Without being limited by theory, it is believed that Si containing films hydrolyze and form silanol species (Si—OH) at the surface in during CMP which is generally regarded as essential step for achieving high removal rates for CMP. Aluminate species subsequently forms an insoluble complex with it similar to Al-silicate. The insoluble complex acts as an inhibitor against further hydrolysis of the films, thereby suppressing the removal rates of the Si containing films.

The amount of a water soluble aluminum compound ranges from about 0.01 wt % to about 10 wt % relative to the total weight of the CMP composition. The preferred range is from about 0.05 wt % to about 3 wt %, and more preferred range is from about 0.1 wt % to about 1 wt %.

The suitable abrasives for this invention include, but are not limited to, high purity colloidal silica particles, alumina, ceria, germania, silica, titania, zirconia, alumina dopes colloidal silica in lattices, ceria coated silica particles and mixtures thereof.

The preferred particulate material is colloidal silica. The colloidal silica can be made from sodium silicate, or can be made from TEOS (tetraethylorthosilicate) or TMOS (tetramethylorthosilicate). Still preferred is high purity colloidal silica with very low levels of trace metal impurities (alkali metals <300 ppb and heavy metals <100 ppb). Examples of high purity colloidal silica that can be used are Fuso™ PL-3, PL2, PL3H and PL3L high purity colloidal silica particles obtained from Fuso Chemical Company, Japan.

A mixture of colloidal silica particles of different particle sizes and types may also yield improved performance The abrasive is present in an amount from 0.01 wt % to 20 wt %, preferably, from 0.05 wt % to 10 wt %, more preferably, from about 0.1 wt % to about 5 wt %.

The polishing composition has a pH above 7; preferably from about 8 to 12; more preferably from about 10 to 12.

Formulations of this invention are especially effective at pH 7 or higher where solubility of the water soluble aluminum compound is higher. Alkaline pH is also suitable for CMP compositions that require protection of metals such as copper and cobalt. Higher pH is also desired for improved colloidal stability for the particles used in the CMP slurry.

The polishing composition may optionally include an oxidizing agent.

The oxidizing agent can be any suitable oxidizing agent.

Suitable oxidizing agents includes, but is not limited to, one or more peroxy-compounds, which comprise at least one peroxy group (O—O). Suitable peroxy-compounds include, for example, but are not limited to, peroxides, persulfates (e.g., monopersulfates and dipersulfates), percarbonates, and acids thereof, and salts thereof, and mixtures thereof.

Other suitable oxidizing agents include, for example, oxidized halides (e.g., chlorates, bromates, iodates, perchlorates, perbromates, periodates, and acids thereof, and mixtures thereof, and the like), perboric acid, perborates, percarbonates, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), mixtures thereof, and the like. Some specific oxidizers that are useful in the composition and method described herein include, but are not limited to, hydrogen peroxide, periodic acid, potassium iodate, potassium permanganate, ammonium persulfate, ammonium molybdate, ferric nitrate, nitric acid, potassium nitrate, and mixtures thereof.

Preferred oxidizing agent is peroxide including, for example, hydrogen peroxide and urea-hydrogen peroxide.

The amount of oxidizing agent ranges from about 0.01 wt % to 10 wt % relative to the total weight of the CMP composition. The preferred range is from about 0.1 wt % to 4 wt %, and more preferred range is from about 0.5 wt % to 2 wt %.

Removal rates of Si containing films such as SiN, SiC, TEOS during CMP formulations can be suppressed with the water soluble aluminum compound even in the absence of oxidizing agent. However certain applications such as metal and barrier CMP would need oxidizer addition.

CMP slurry formulations may also optionally include surfactants or surface wetting agents. Surfactants may be used to for a variety of purposes such as reducing defects on the wafers, tuning of removal rates and reduction in post-polish topography. The suitable surfactant includes, but is not limited to, a). non-ionic surface wetting agents; b). anionic surface wetting agents; c). cationic surface wetting agents; d). ampholytic surface wetting agents; and mixtures thereof.

In one aspect, the surfactant can be a nonionic surfactant. Non-ionic surfactants may be chosen from a range of chemical types including but not limited to long chain alcohols, ethoxylated alcohols, ethoxylated acetylenic diol surfactants, polyethylene glycol alkyl ethers, proplylene glycol alkyl ethers, glucoside alkyl ethers, polyethylene glycol octylphenyl ethers, polyethylene glycol alkylpgenyl ethers, glycerol alkyl esters, polyoxyethylene glycol sorbiton alkyl esters, sorbiton alkyl esters, cocamide monoethanol amine, cocamide diethanol amine dodecyl dimethylamine oxide, block copolymers of polyethylene glycol and polypropylene glycol, polyethoxylated tallow amines, fluorosurfactants. The molecular weight of surfactants may range from several hundreds to over 1 million. The viscosities of these materials also possess a very broad distribution.

Several commercially available nonionic surfactants that can be used in the CMP polishing slurries include, but are not limited to ethoxylated alcohols such as those from the Tergitol® series (e.g., Tergitol® 15530, Tergitol® 15S9), manufactured by Dow Chemical; surfactants from the Surfynol® series (e.g. Surfynol® 440 and Surfynol® 465), and Dynol™ series (e.g. Dynol™ 607 and Dynol™ 604) manufactured by Air Products and Chemicals, Inc.; fluorinated surfactants, such as those from the Zonyl® family (e.g., Zonyl® FSO and Zonyl® FSN surfactants), manufactured by E.I. DuPont de Nemours and Company; Alkoxylated surfactant such as Tego® Wet 510 manufactured from Evonik; fluorinated PolyFox® nonionic surfactants (e.g., PF159 nonionic surfactants), manufactured by Omnova; or combinations thereof.

In another aspect, the surfactant can be an anionic surface wetting agents are compounds possess the negative net charge on major part of molecular frame. These compounds include, but are not limited to salts with suitable hydrophobic tails, such as alkyl carboxylate, alkyl polyacrylic salt, alkyl sulfate, alkyl phosphate, alkyl bicarboxylate, alkyl bisulfate, alkyl biphosphate, such as alkoxy carboxylate, alkoxy sulfate, alkoxy phosphate, alkoxy bicarboxylate, alkoxy bisulfate, alkoxy biphosphate, such as substituted aryl carboxylate, substituted aryl sulfate, substituted aryl phosphate, substituted aryl bicarboxylate, substituted aryl bisulfate, substituted aryl biphosphate etc. The counter ions for this type of surface wetting agents include, but are not limited to potassium, ammonium and other positive ions. The molecular weights of these anionic surface wetting agents range from several hundred to several hundred-thousands.

In another aspect, the surfactant can be cationic surface wetting agents possess the positive net charge on major part of molecular frame. Cationic surfactants are typically halides of molecules comprising hydrophobic chain and cationic charge centers such as amines, quaternary ammonium, benzyalkonium and alkylpyridinium ions.

Yet, in another aspect, the surfactant can be an ampholytic surface wetting agents possess both positive (cationic) and negative (anionic) charges on the main molecular chains and with their relative counter ions. The cationic part is based on primary, secondary, or tertiary amines or quaternary ammonium cations. The anionic part can be more variable and include sulfonates, as in the sultaines CHAPS (3-[(3-Cholamidopropyl)dimethylammonio]-1-propanesulfonate) and cocamidopropyl hydroxysultaine. Betaines such as cocamidopropyl betaine have a carboxylate with the ammonium. Some of the ampholytic surfactants may have a phosphate anion with an amine or ammonium, such as the phospholipids phosphatidylserine, phosphatidylethanolamine, phosphatidylcholine, and sphingomyelins.

Examples of suitable commercially available surfactants include TRITON™, Tergitol™, DOWFAX™ family of surfactants manufactured by Dow Chemicals and various surfactants in SUIRFYNOL™, DYNOL™, Zetasperse™, Nonidet™, and Tornado™ surfactant families, manufactured by Air Products and Chemicals. Suitable surfactants of surfactants may also include polymers comprising ethylene oxide (EO) and propylene oxide (PO) groups. An example of EO-PO polymer is Tetronic™ 90 R4 from BASF Chemicals.

The amount of surfactant ranges from about 0.0001 wt % to about 10 wt % relative to the total weight of the CMP composition. The preferred range is from about 0.001 wt % to about 1 wt %, and more preferred range is from about 0.005 wt % to about 0.1 wt %.

The CMP polishing composition may further comprise a pH-adjusting agent to improve the stability of the polishing composition, tune the ionic strength of the polishing composition, and improve the safety in handling and use. The pH-adjusting agent may be used to raise or lower the pH of the polishing composition.

Suitable pH-adjusting agents to lower the pH of the polishing composition include various organic and inorganic acids including but not limited to hydrochloric acid, nitric acid, sulfuric acid, chloroacetic acid, tartaric acid, succinic acid, citric acid, malic acid, malonic acid, sulfonic acid, phosphoric acid, various fatty acids, various polycarboxylic acids, hydrogen chloride, and mixtures thereof.

Suitable pH-adjusting agents to raise the pH of the polishing composition include organic or inorganic bases including but not limited to potassium hydroxide, sodium hydroxide, ammonia, quaternary organic ammonium hydroxide (e.g. tetramethylammonium hydroxide), ethylenediamine, piperazine, polyethyleneimine, modified polyethyleneimine, and mixtures thereof.

The amount of pH-adjusting agent ranges from about 0.0001 wt % to about 5 wt % relative to the total weight of the CMP composition. The preferred range is from about 0.0005% to about 1 wt %, and more preferred range is from about 0.0005 wt % to about 0.5 wt %, and most preferred range is from about 0.001 wt % to about 0.1 wt %.

The CMP composition may further comprise a corrosion inhibitor.

The suitable corrosion inhibitor includes, but is not limited to, chemical additives contain nitrogen atoms in the molecules. Examples of corrosion inhibitors include but not limited to benzotriazole (BTA) and benzotriazole derivatives, triazole and their relative derivatives; imidizole, pyrazole and its derivatives, benzoimidizaole and its derivatives, and combinations thereof.

The amount of corrosion inhibitor ranges from about 0.0005 wt % to about 0.5 wt % relative to the total weight of the CMP composition. The preferred range is from about 0.0025% to about 0.15 wt %, and more preferred range is from about 0.01 wt % to about 0.1 wt %, CMP composition may further comprise organic acid. The organic acid can be any suitable organic acid includes but is not limited to an aromatic organic acid, and amino acid or salt thereof. The aromatic organic acid can be described as a ligand that can have some interactions with some films on the surfaces of the wafers.

The aromatic organic acid includes, but is not limited to benzenesulfonic acid or toluenesulfonic acid or any other organic acid or amino acid.

The amount of organic acid ranges from about 0.1 wt % to about 5 wt % relative to the total weight of the CMP composition. The preferred range is from about 0.2 wt % to about 2 wt %, and more preferred range is from about 0.25 wt % to about 1 wt %.

CMP slurry may include a chelating or complexing agent. Complexing agent may serve different purposes such as increasing removal rates during CMP, reduce pad staining, increasing solubility of the water soluble aluminum compound, increasing the pH range where the aluminum compounds are soluble.

The suitable chelating agent includes, but is not limited to organic acids and their salts; polymeric acids and their salts; water soluble copolymers and their salts; copolymers and their salts containing at least two different types of acid groups selected from carboxylic acid groups; sulfonic acid groups; phosphoric acids; and pyridine acids in the same molecule of a copolymer; polyvinyl acids and their salts, inorganic potassium silicate and ammonium silicate; polyethylene oxide; polypropylene oxide; pyridine, pyridine derivatives, bipyridine, bipyridine derivatives, and combinations thereof.

The organic acids include but are not limited to amino acids; carboxylic acids; phosphoric acids; sulfonic acids; polyvinyl acids; and pyridine acids; bipyridine acids.

The polymeric acids and their salts include but are not limited to polymeric compounds that having a functional group selected from the group consisting of carboxylic acids and their salts thereof; sulfonic acids and their salts thereof; phosphonic acids and their salts thereof; pyridine acids and their salts thereof. Examples are polymeric carboxylic acids and their salts thereof; polymeric sulfonic acids and their salts thereof; polymeric phosphonic acids and their salts thereof; polymeric pyridine acids and their salts thereof. More specific examples are polyacrylic acids and their salts; polystyrene sulfonic acids and their salts; bipyridine acids and their salts.

The amount of chelating agent ranges from about 0.001 wt % to about 5 wt % relative to the total weight of the CMP composition. The preferred range is from about 0.01% to about 2.0 wt %, and more preferred range is from about 0.1 wt % to about 1.0 wt %.

The CMP slurry formulations may include a catalyst to increase the removal rates of metallic films. Catalyst may comprise a metal compound of Ag, Co, Cr, Cu, Fe, Mo, Mn, Nb, Ni, Os, Pd, Ru, Sn, Ti, V and mixtures thereof having multiple oxidation states. Metal compound may be added to the CMP slurry by dissolving the compound. Alternatively, particles with a surface containing the compounds of metals with multiple oxidation states may be used as heterogeneous catalysts. Catalysts promote hydroxyl radical formation when oxidizers with peroxy group (O—O) such as hydrogen peroxide is used in CMP formulations. Hydroxyl radical formation would increase the removal rates of metallic films such as tungsten. Catalyst concentration in the CMP formulations may range from 0.0001 wt % to 1 wt % or more preferably between 0.001 wt % and 0.5 wt %.

The CMP composition may comprise biological growth inhibitors or preservatives to prevent bacterial and fungal growth during storage.

The biological growth inhibitors include, but are not limited to, tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, methylisothiazolinone, 5-chloro-2-methyl-4-isothiazolin-3-one (chloromethylisothiazolinone or CMIT), sodium chlorite, and sodium hypochlorite. Some of the commercially available preservatives include KATHON™ and NEOLENE™ product families from Dow Chemicals, and Preventol™ family from Lanxess. More are disclosed in U.S. Pat. No. 5,230,833 (Romberger et al.) and US Patent Application No. US 20020025762. The contents of which are hereby incorporated by reference as if set forth in their entireties.

Dispersing agents may be used to improve colloidal stability of particles. Dispersing agents may comprise surfactants and polymers. Examples of dispersing agents include poly-acrylic acid, poly-meth acrylic acid.

The amount of dispersing agent ranges from about 0.001 wt % to about 5 wt % relative to the total weight of the CMP composition. The preferred range is from about 0.01% to about 1.0 wt %, In certain embodiments, the formulations can be made in a concentrated form and diluted at point of use with water and optionally oxidizer.

In certain embodiments, formulations can be shipped in two or more parts; an abrasive rich part and a chemical rich part, to be mixed at the point of use in order to eliminate any stability issues.

In one embodiment, the compositions of this invention may be used to polish the conducting metal structures selectively to the stopping layer surrounding the structure, wherein the stopping layer comprise silicon or a compound of silicon including but not limited to silicon oxide, silicon nitride, silicon oxy-nitride, silicon carbide or silicon oxycarbide, poly-silicon, amorphous silicon or any other combination comprising silicon, oxygen, oxygen, carbon, nitrogen, hydrogen. Conducting metal structure may comprise metals or alloys such as copper, tungsten, cobalt. The removal rate ratio between the blanket metallic film and the stopping layer is greater than 10, or more preferably greater than 50 or even more preferably greater than 100.

In yet another embodiment, the polishing slurries of this invention may be used to polish the conducting metal structures with one or more metallic layers sandwiched between the conducting metal and the surrounding layer. The sandwiched metallic layer may provide functions such as but not limited to barrier against metal ion diffusion, a liner material, a glue layer. The sandwiched metallic layer may comprise but not limited to titanium, titanium nitride (TIN), cobalt, ruthenium, tantalum, tantalum nitride and self-forming barrier films which are alloy films of the interconnect metal with metals such as but not limited to Mn, Cr, V, Ru, Zr, C, Mo, Ag, W. The structures may also include a stopping layer comprising silicon or a compound of silicon including but not limited to silicon oxide, silicon nitride, silicon oxy-nitride, silicon carbide or silicon oxycarbide, poly-silicon, amorphous silicon or any other combination comprising silicon, oxygen, oxygen, carbon, nitrogen, hydrogen. Blanket metallic barrier layer is polished at removal rates, preferably greater than 200 Å/min or preferably greater than 300 Å/min at 1.5 psi downforce, while suppressing the removal rates of stopping film to less than 100 Angstroms/min or preferably less than 50 Angstroms/min or most preferably less than 10 Angstroms/min.

General Experimental Procedure

The associated processes described herein entail use of the aforementioned composition for barrier chemical mechanical planarization of patterned substrate surfaces.

The polishing composition and associated processes and systems described herein are effective for CMP of a substrate with a variety of surfaces, particularly useful for retarding stop layer, such as SiN and/or SiC removal rate.

In the processes, a substrate (e.g., a patterned wafer with a variety of surfaces) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition is applied (usually continuously) on the pad during CMP processing to effect the removal of material to planarize the substrate.

Polishing Pad: Fujibo H7000HN pad, supplied by Narubeni America Corporation, was used for CMP process. Co (PVD) barrier layer was deposited by PVD process. SiN and/or SiC film was deposited by PECVD deposition process. TEOS oxide film was deposited by Chemical Vapor Deposition (CVD) using tetraethyl orthosilicate as the precursor.

Parameters

Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min
Removal Rates and Removal selectivity
Removal Rate (RR)=(film thickness before polishing–film thickness after polishing)/polish time.
Cu RR: Measured PVD Co removal rate at 2.0 psi (with soft Fujibo pad) down pressure of the CMP tool
SiN RR: Measured SiN removal rate at 2.0 psi (with soft Fujibo pad) down pressure of the CMP tool
BD1 RR: Measured BD1 removal rate at 2.0 psi (with soft Fujibo pad) down pressure of the CMP tool
Co RR: Measured Co removal rate at 2.0 psi (with soft Fujibo pad) down pressure of the CMP tool
TaN RR: Measured TaN removal rate at 2.0 psi (with soft Fujibo pad) down pressure of the CMP tool
All percentages are weight percentages unless otherwise indicated.

In the examples presented below, CMP experiments were run using the procedures and experimental conditions given below.

The CMP tool that was used in the examples is a Mirra®, manufactured by Applied Materials, 3050 Boweres Avenue, Santa Clara, Calif., 95054. A Fujibo H7000HN pad, supplied by Narubeni America Corporation, was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by Air Products Chemical Incorporation, at baseline conditions. Polishing experiments were conducted using electroplating deposited copper, low-k dielectric layer materials (Black Diamond®), tantalum nitride, PVD cobalt and silicon nitride wafers. These blanket wafers were purchased from Silicon Valley Microelectronics, 1150 Campbell Ave, CA, 95126, and Advantiv Corporation.

In the examples, the chemicals, such as aluminate salt, or the chemicals used to generate the aluminate salt, such as aluminum hydroxide or $Al(OH)_3$, potassium hydroxide or KOH, sodium hydroxide or NaOH, were purchased from Sigma-Aldrich Corporation.

WORKING EXAMPLES

In the following working examples, the CMP polishing slurries comprised a corrosion inhibitor such as benzotriazole (BTA) and benzotriazole derivatives, triazole or triazole derivatives, such as 3-amino-1,2,4-triazole, 3,5-diamino-1,2,4-triazole, a chemical additive as ligand such as benzenesulfonic acid as the surface wetting agent/surfactant, an aluminate salt, an abrasive, a pH-adjusting agent, and optionally an oxidizing agent and an aromatic organic acid.

TABLE I

| Control Composition | Wt % |
| --- | --- |
| Potassium hydroxide(KOH) | 0.7021 |
| Benzotriazole | 0.0105 |
| Benzenesulfonic acid | 0.4540 |
| Fuso PL3 | 3.1035 |
| Dynol 607 | 0.0078 |
| Water | 95.7221 |

The barrier CMP slurries were used for polishing various types of films of relevance for barrier applications. The pH of the CMP polishing slurries were around 10-11.

A barrier CMP composition (shown in Table I) was used as a control or reference composition.

The working barrier CMP polishing slurries were obtained by adding different amount of aluminate salt to the control composition. Alternatively, the aluminate salt can be generated in situ by mixing a stoichiometric amount of aluminum hydroxide, $Al(OH)_3$ with potassium hydroxide, KOH, or sodium hydroxide, NaOH.

Example 1

Figure 1:
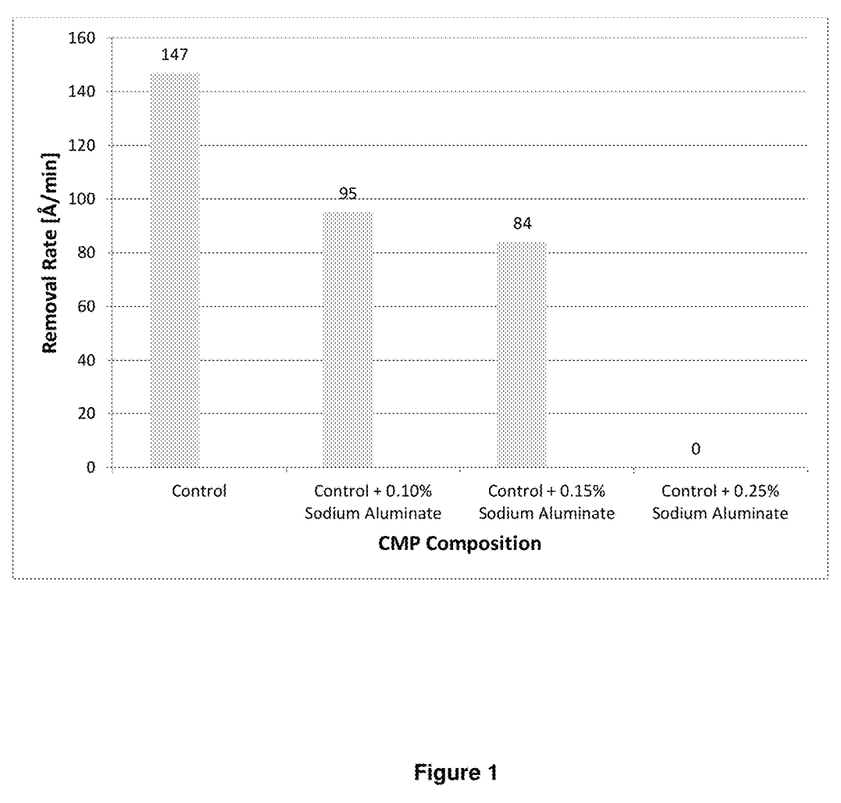
FIG. 1 shows the SiN removal rates from barrier CMP polishing slurries comprising a stop-on aluminate salt additive (sodium aluminate)

0.10 wt %, 0.15 wt % and 0.25 wt % of sodium aluminate ($NaAlO_2$) were added to the control composition (as shown in Table I) to obtain the barrier CMP polishing slurries as shown in Table II. The CMP slurries were then used to polish SiN substrate. The SiN removal rate results were shown in Table II and FIG. 1.

Figure 2:
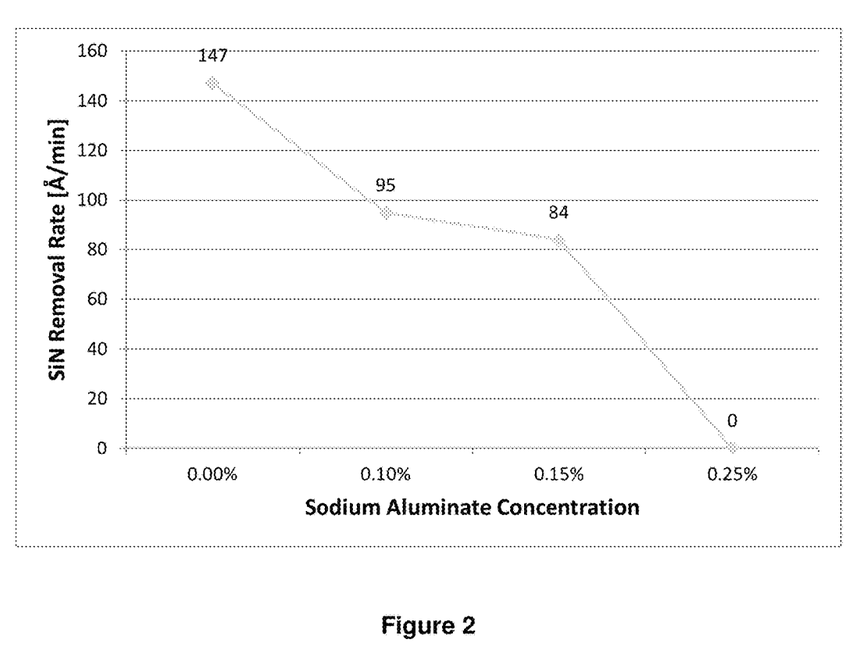
FIG. 2 shows the SiN removal rates as the function of the aluminate salt (sodium aluminate) concentration in the barrier CMP polishing slurries

FIG. 2 gave the SiN removal rate as the function of the concentrations of sodium aluminate in the slurries.

TABLE II

| CMP polishing Composition | SiN RR (Å/min) |
| --- | --- |
| Control | 147 |
| Control + 0.10 wt % Sodium Aluminate | 95 |
| Control + 0.15 wt % Sodium Aluminate | 84 |
| Control + 0.25 wt % Sodium Aluminate | 0 |

The results showed that with the addition of 0.10 wt % of sodium aluminate ($NaAlO_2$) the SiN removal rate was reduced by 35% versus the control composition without any aluminate salt additive. The addition of 0.15 wt % of sodium aluminate brought down the SiN removal rate by 43% versus the control composition. While with the addition of 0.25 wt % of sodium aluminate, the SiN removal rate dropped to 0.

The data also indicated that the SiN removal rate could be tuned as desired.

Example 2

The same CMP slurries used in Example 1 were also used to polish a number of films of relevance for barrier application such as copper and low-K (BD1).

Figure 3:
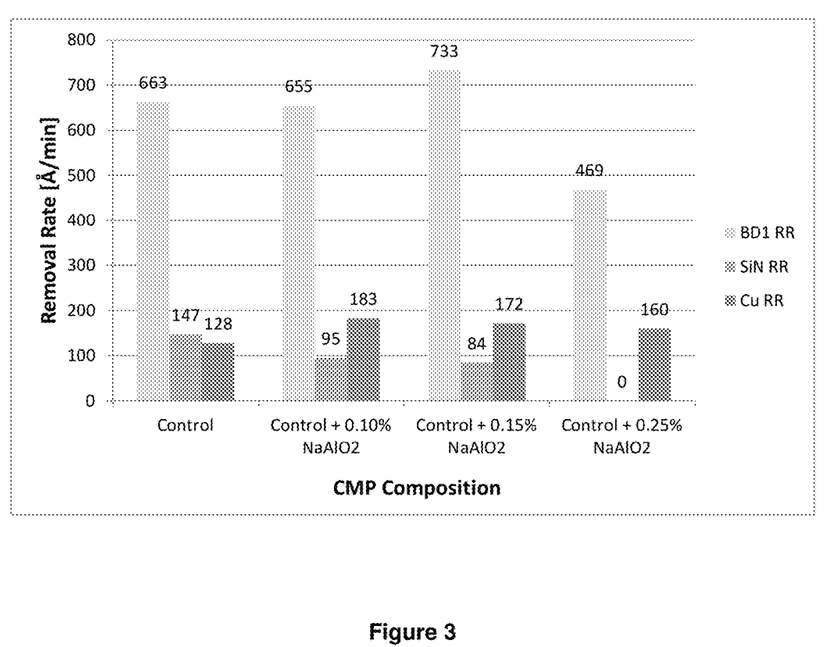
FIG. 3 shows the removal rates of different films in barrier layer using barrier CMP polishing slurries containing an aluminate salt (sodium aluminate) with no oxidizing agent

The results of removal rates were shown in Table III and FIG. 3.

TABLE III

|  | BD1 RR (Å/min) | SiN RR (Å/min) | Cu RR (Å/min) |
| --- | --- | --- | --- |
| Control | 663 | 147 | 128 |
| Control + 0.10 wt % Sodium Aluminate | 655 | 95 | 183 |
| Control + 0.15 wt % Sodium Aluminate | 733 | 84 | 172 |
| Control + 0.25 wt % Sodium Aluminate | 469 | 0 | 160 |

The results have shown that the sodium aluminate additive reduced the SiN removal rate, meanwhile did not at all or only minimally affect the removal rates of other barrier films.

Example 3

Measurements were performed with CMP polishing slurries containing peroxide (as an oxidizing agent).

Figure 4:
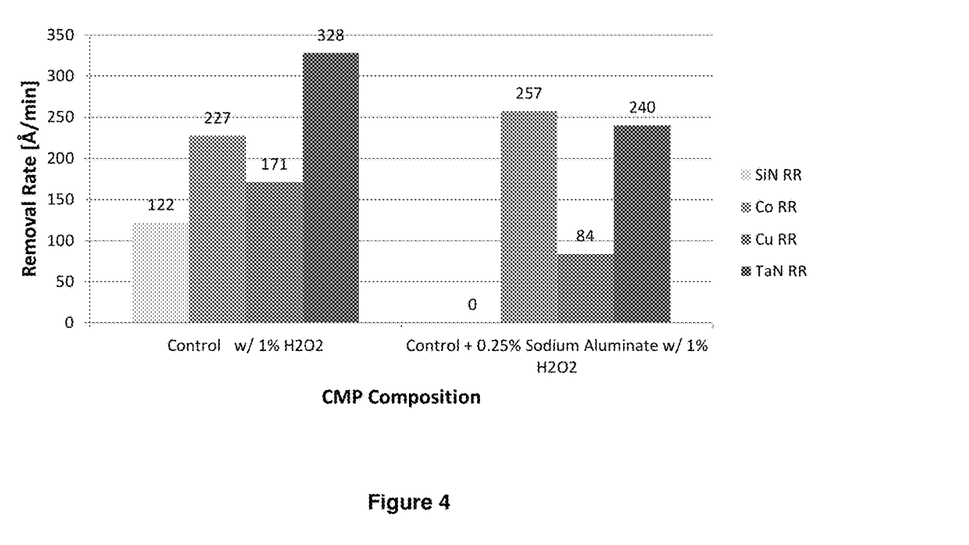
FIG. 4 shows the removal rates of different films in barrier layer using barrier CMP polishing slurries containing an aluminate salt (sodium aluminate) and an oxidizing agent

Removal rates were measured on different films cobalt, copper, and tantalum nitride. The results were shown in Table IV and FIG. 4.

TABLE IV

| Formulation | SiN RR (Å/min) | Co RR (Å/min) | Cu RR (Å/min) | TaN RR (Å/min) |
| --- | --- | --- | --- | --- |
| Control + 1 wt % $H_2O_2$ | 122 | 227 | 171 | 328 |
| Control + 0.25 wt % Sodium Aluminate + 1 wt % $H_2O_2$ | 0 | 257 | 84 | 240 |

Again, the results have shown that the sodium aluminate additive in the CMP slurries containing peroxide reduced the removal rate on SiN, but only minimally affect the removal rates of other barrier films.

Example 4

0.10 wt %, 0.20 wt %, 0.25 wt % and 0.3 wt % of potassium aluminate ($KAlO_2$) were added to the control composition (as shown in Table I) to obtain the barrier CMP polishing slurries.

The potassium aluminate ($KAlO_2$) was generated in situ by mixing a stoichiometric amount of aluminum hydroxide, $Al(OH)_3$ with potassium hydroxide, KOH.

The CMP slurries were used to polish a number of films of relevance for barrier application such as cobalt, copper, low-K (BD1), silicon oxide ($SiO_2$) (TEOS), and silicon nitride (SiN).

Figure 5:
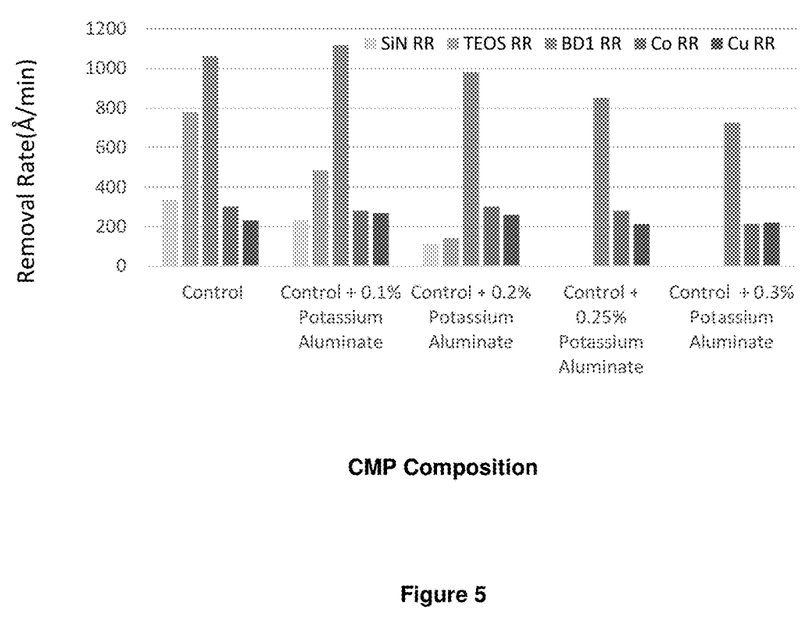
FIG. 5 shows the removal rates of different films in barrier layer using barrier CMP polishing slurries containing an aluminate salt (potassium aluminate) with no oxidizing agent
Figure 6:
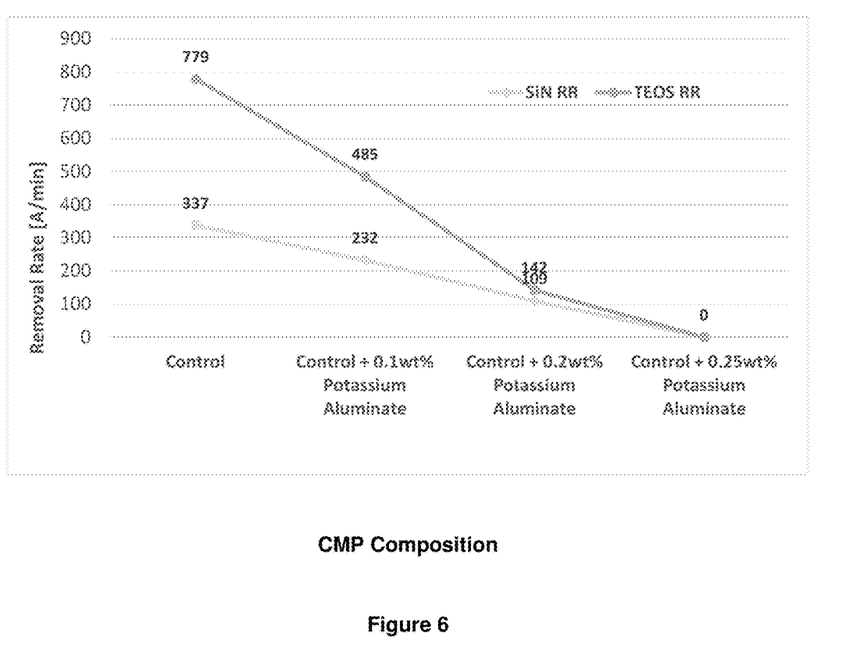
FIG. 6 shows the silicon nitrate (SiN) and silicon oxide (TEOS) removal rates as the function of the aluminate salt concentration (potassium aluminate) in the barrier CMP polishing slurries

The results of removal rates were shown in Table V and FIGS. 5 and 6.

TABLE V

| | SiN RR (Å/min) | TEOS RR (Å/min) | BD1 RR (Å/min) | Co RR (Å/min) | Cu RR (Å/min) |
|---|---|---|---|---|---|
| Control (Ctrl) | 337 | 779 | 1061 | 301 | 231 |
| Ctrl + 0.1 wt % Potassium Aluminate | 232 | 485 | 1116 | 280 | 268 |
| Ctrl + 0.2 wt % Potassium Aluminate | 109 | 142 | 981 | 300 | 258 |
| Ctrl + 0.25 wt % Potassium Aluminate | 0 | 0 | 851 | 279 | 212 |
| Ctrl + 0.3 wt % Potassium Aluminate | 0 | 0 | 724 | 214 | 219 |

The results showed that with the addition of potassium aluminate ($KAlO_2$) both SiN removal rate and TEOS removal rate were reduced versus the control composition without any aluminate salt additive. The addition of 0.25 wt % of potassium aluminate brought down the SiN removal rate and TEOS removal rate to 0.

The data also indicated that the SiN removal rate and TEOS removal rate could be tuned as desired.

As the results for using sodium aluminate, the removal rates of other films such as cobalt, copper, or a low-K film like Black Diamond 1™ (BD1) were least affected.

Example 5

0.2078 wt % of Aluminum Acetate (AlAc) was added to the control composition (as shown in Table I) to obtain the barrier CMP polishing composition.

The CMP composition was used to polish a number of films of relevance for barrier application such as cobalt, copper, low-K (BD1), silicon oxide ($SiO_2$) (TEOS), and silicon nitride (SiN).

Figure 7:
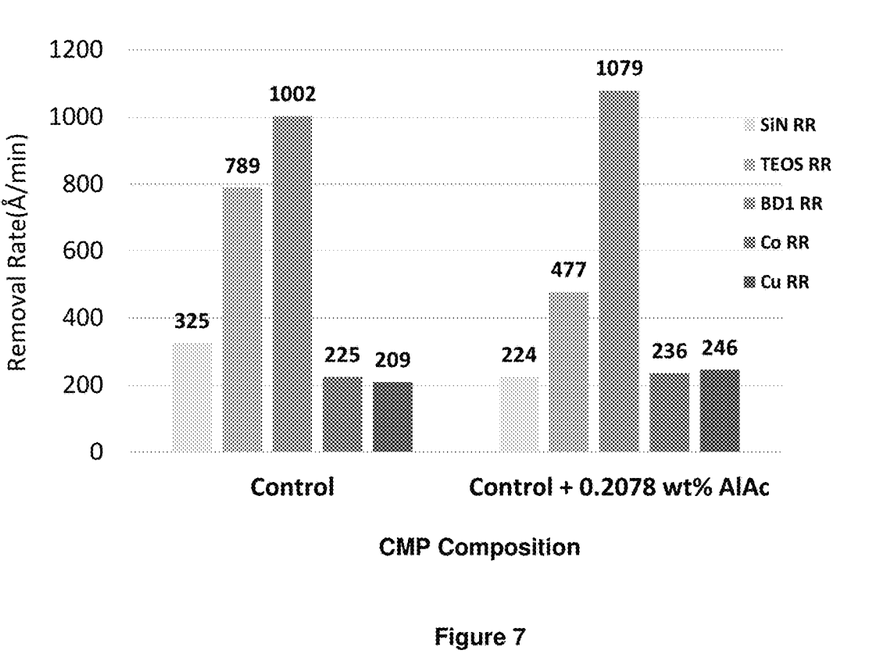
FIG. 7 shows the removal rates of different films in barrier layer using barrier CMP polishing slurries containing an aluminate salt (aluminum acetate) with no oxidizing agent

The results of removal rates were shown in Table VI and FIG. 7.

TABLE VI

| | SiN RR (Å/min) | TEOS RR (Å/min) | BD1 RR (Å/min) | Co RR (Å/min) | Cu RR (Å/min) |
|---|---|---|---|---|---|
| Control (Ctrl) | 325 | 789 | 1002 | 225 | 209 |
| Ctrl + 0.2078 wt % AlAc | 224 | 477 | 1079 | 236 | 246 |

The results showed that with the addition of 0.2078 wt % aluminum acetate, the SiN removal rate was reduced by 31% versus the control composition; and TEOS removal rate was reduced by 40% versus the control composition. While, the composition had no effect on the removal rates of other films.

It has been demonstrated that the addition of an aluminate salt to a colloidal silica composition resulted in a reduction of removal rates for silicon containing films (such SiN and TEOS) while no or minimum effect on other films such as cobalt, copper, or a low-K film like a low-K film like Black Diamond 1™ (BD1).

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

The invention claimed is:

1. A polishing composition comprising:
   0.01 wt. % to 20 wt. % of colloidal silica particles;
   0.01 wt. % to about 10 wt. % of a water soluble aluminum compound selected from the group consisting of sodium aluminate, potassium aluminate, aluminum acetate, aluminum hydroxide, and combinations thereof;
   0.0005 wt % to about 0.5 wt % of a corrosion inhibitor selected from the group consisting of benzotriazole (BTA) and its derivatives, triazole and its derivatives, and combinations thereof;
   0.0001 wt. % to about 5 wt. % of a pH adjusting agent selected from the group consisting of potassium hydroxide, sodium hydroxide, ammonia, quaternary organic ammonium hydroxide;
   0.1 wt. % to 5 wt. % of an organic acid selected from the group consisting of benzenesulfonic acid, toluenesulfonic acid, and combinations thereof;
   and
   water;
   optionally
   0.0001 wt. % to 10 wt. % of a surfactant selected from the group consisting of a). non-ionic surface wetting agents; b). anionic surface wetting agents; c). cationic surface wetting agents; d). ampholytic surface wetting agents; and mixtures thereof; and
   0.01 wt. % to 10 wt. % of an oxidizing agent selected from the group consisting of peroxy-compound comprising at least one peroxy group (O—O), oxidized halide, perboric acid, perborate, percarbonate, peroxyacid, permanganate, chromate, cerium compound, ferricyanide, and mixtures thereof;
   and
   wherein the polishing composition has a pH of 8 to 12.

2. The polishing composition of claim 1, wherein
   the non-ionic surface wetting agent is selected from the group consisting of ethoxylated alcohol, ethoxylated acetylenic diol surfactant, polyethylene glycol alkyl ether, proplylene glycol alkyl ether, glucoside alkyl ether, polyethylene glycol octylphenyl ether, polyethylene glycol alkylpgenyl ether, glycerol alkyl ester, polyoxyethylene glycol sorbiton alkyl ester, sorbiton alkyl ester, cocamide monoethanol amine, cocamide diethanol amine, dodecyl dimethylamine oxide, block copolymers of polyethylene glycol and polypropylene glycol, polyethoxylated tallow amines, fluorosurfactant, and combinations thereof;
   the anionic surface wetting agent is selected from the group consisting of alkyl carboxylate, alkyl polyacrylic salt, alkyl sulfate, alkyl phosphate, alkyl bicarboxylate, alkyl bisulfate, alkyl biphosphate, alkoxy carboxylate, alkoxy sulfate, alkoxy phosphate, alkoxy bicarboxylate, alkoxy bisulfate, alkoxy biphosphate, substituted aryl carboxylate, substituted aryl sulfate, substituted aryl phosphate, substituted aryl bicarboxylate, substituted aryl bisulfate, substituted aryl biphosphate, and combinations thereof;
   the cationic surface wetting agent is a halide of molecules comprising hydrophobic chain and cationic charge center selected from the group consisting of amine, quaternary ammonium, benzyalkonium and alkylpyridinium ion;

and the ampholytic surface wetting agent possess both positive (cationic) and negative (anionic) charges on the main molecular chains and with their relative counter ions.

\* \* \* \* \*